(12) United States Patent
Ito

(10) Patent No.: US 10,494,178 B2
(45) Date of Patent: Dec. 3, 2019

(54) TEACHING APPARATUS, TRANSPORT SYSTEM, AND METHOD FOR MEASURING POSITIONING PINS

(71) Applicant: MURATA MACHINERY, LTD., Kyoto-shi, Kyoto (JP)

(72) Inventor: Yasuhisa Ito, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 15/755,617

(22) PCT Filed: Jul. 14, 2016

(86) PCT No.: PCT/JP2016/070854
§ 371 (c)(1),
(2) Date: Feb. 27, 2018

(87) PCT Pub. No.: WO2017/038268
PCT Pub. Date: Mar. 9, 2017

(65) Prior Publication Data
US 2018/0251299 A1 Sep. 6, 2018

(30) Foreign Application Priority Data

Aug. 28, 2015 (JP) ................. 2015-168970

(51) Int. Cl.
| | |
|---|---|
| *B65G 1/04* | (2006.01) |
| *H01L 21/67* | (2006.01) |
| *H01L 21/677* | (2006.01) |
| *H01L 21/68* | (2006.01) |
| *H01L 21/687* | (2006.01) |

(52) U.S. Cl.
CPC ............ *B65G 1/04* (2013.01); *H01L 21/6773* (2013.01); *H01L 21/67265* (2013.01); *H01L 21/68* (2013.01); *H01L 21/68707* (2013.01)

(58) Field of Classification Search
CPC combination set(s) only.
See application file for complete search history.

(56) References Cited

U.S. PATENT DOCUMENTS

| | | | |
|---|---|---|---|
| 2003/0110649 A1* | 6/2003 | Hudgens | ........... H01L 21/67259 33/286 |
| 2006/0161304 A1* | 7/2006 | Shiwaku | .............. G05B 19/421 700/264 |
| 2013/0197691 A1 | 8/2013 | Tsubaki et al. | |

FOREIGN PATENT DOCUMENTS

| | | |
|---|---|---|
| CN | 103118962 A | 5/2013 |
| JP | 2000-072378 A | 3/2000 |

(Continued)

OTHER PUBLICATIONS

Official Communication issued in International Patent Application No. PCT/JP2016/070854, dated Oct. 4, 2016.

(Continued)

*Primary Examiner* — Kyle O Logan
(74) *Attorney, Agent, or Firm* — Keating & Bennett, LLP

(57) ABSTRACT

A teaching apparatus is transported by a transport vehicle capable of transporting an article and measures the positions of multiple positioning pins disposed in the placement position of the article. The teaching apparatus includes an apparatus body and multiple touch panels that are able to individually touch the positioning pins and to be independently raised and lowered with respect to the apparatus body.

8 Claims, 8 Drawing Sheets

(56) References Cited

FOREIGN PATENT DOCUMENTS

JP          3479969 B2     12/2003
JP      2015-086019 A      5/2015

OTHER PUBLICATIONS

Official Communication issued in International Patent Application No. PCT/JP2016/070854, dated Mar. 6, 2018.

* cited by examiner

TEACHING APPARATUS, TRANSPORT SYSTEM, AND METHOD FOR MEASURING POSITIONING PINS

BACKGROUND OF THE INVENTION

1. Field of the Invention

The present invention relates to a teaching apparatus, a transport system, and a method for measuring positioning pins.

2. Description of the Related Art

A transport system that transports a container (article) containing semiconductor wafers, reticles, or the like using a transport vehicle is known to teach the transport vehicle the placement position of the container in order to accurately place the container on a shelf at the entrance/exit of a board processor, storage cabinet, or the like. The entrance/exit is provided with multiple positioning pins to position the container, and it is necessary to teach the transport vehicle so that the positioning pins are inserted into grooves in the rear surface of the container when the container is placed. While it is possible to teach the transport vehicle, for example, by obtaining images of the positioning pins, nearby illuminants or light reflectors reduce the image detection accuracy. To address this problem, a proposal has been made to measure the positions of positioning pins using a teaching apparatus that uses touch sensors such as touch panels (see Japanese Patent No. 3479969).

However, the upper ends of the positioning pins may differ in height. If the teaching apparatus of Japanese Patent No. 3479969 touches any such positioning pin and thus is inclined, it may fail to accurately measure the positions of the positioning pins. Similarly, if a shelf having the positioning pins disposed thereon is inclined, the upper ends of the positioning pins differ in height, but the teaching apparatus of Japanese Patent No. 3479969 has difficulty in measuring the inclination of the shelf.

SUMMARY OF THE INVENTION

In view of the foregoing, preferred embodiments of the present invention provide teaching apparatuses, transport systems, and methods for measuring positioning pins that are able to accurately measure the positions of positioning pins even if the upper ends thereof differ in height.

A preferred embodiment of the present invention provides a teaching apparatus that is transported by a transport vehicle capable of transporting an article and measures positions of multiple positioning pins disposed in a placement position of the article. The teaching apparatus includes an apparatus body and multiple touch panels that are able to touch the positioning pins and to be independently raised and lowered with respect to the apparatus body.

The teaching apparatus may include an ascent/descent amount detector that measures the amounts of ascent/descent of the touch panels with respect to the apparatus body. The teaching apparatus may include a level that detects an inclination of the apparatus body with respect to a horizontal plane. The touch panels may be disposed so as to be suspended from the apparatus body by self-weight and may be able to be raised with respect to the apparatus body when touching the positioning pins. The touch panels may be disposed so as to correspond to two of the positioning pins, and the apparatus body may include a touch plate that is able to touch another of the positioning pins and to be raised and lowered with respect to the apparatus body. The apparatus body may include a supported portion that is able to be supported by the transport vehicle.

Another preferred embodiment of the present invention also provides a transport system including a transport vehicle that is able to move while supporting an article and transfers the article to a placement position in which multiple positioning pins are disposed, by lowering the article from above and the teaching apparatus that is able to be transported by the transport vehicle and measures positions of the positioning pins.

An additional preferred embodiment of the present invention provides a method for measuring positions of multiple positioning pins disposed in a position in which a transport vehicle places an article. The method includes causing the transport vehicle to lower multiple touch panels from above the placement position so that the touch panels individually touch the positioning pins, the touch panels being disposed so as to be able to be independently raised and lowered with respect to the apparatus body, and calculating the positions of the positioning pins based on detection results obtained by the touch panels.

The method may include calculating an inclination of a plane including upper ends of the positioning pins based on the amounts of ascent of the touch panels.

A teaching apparatus according to a preferred embodiment of the present invention causes the positioning pins to touch the touch panels that are able to be independently raised and lowered. Thus, even if the upper ends of the positioning pins differ in height, it suppresses an inclination of the apparatus body by raising and lowering the touch panels and thus is able to accurately measure the positions of the positioning pins.

A teaching apparatus according to a preferred embodiment of the present invention that includes the ascent/descent amount detector that measures the amounts of ascent/descent of the touch panels with respect to the apparatus body is able to measure the heights of the upper ends of the positioning pins by detecting the amounts of ascent/descent of the touch panels. The teaching apparatus that includes the level that detects the inclination of the apparatus body with respect to the horizontal plane is able to measure the heights of the upper ends of the positioning pins with respect to the horizontal plane based on the amounts of ascent/descent of the touch panel. The teaching apparatus where the touch panels are disposed so as to be suspended from the apparatus body by self-weight and are able to be raised with respect to the apparatus body when touching the positioning pins is able to reduce the apparatus cost without using a driver or the like to the raise and lower the touch panels. If the touch panels are disposed so as to correspond to two of the positioning pins and the apparatus body includes the touch plate that is able to touch another of the positioning pins and to be raised and lowered with respect to the apparatus body, it is possible to reduce the number of touch panels to be used and thus to reduce the apparatus cost. Also, if the apparatus body includes the touch plate that is able to be raised and lowered, it is possible to significantly reduce or prevent the inclination of the apparatus body when the positioning pin touches the touch plate. If the apparatus body includes the supported portion that is able to be supported by the transport vehicle, teaching is performed stably due to the support of the supported portion by the transport vehicle.

A transport system according to a preferred embodiment of the present invention includes the teaching apparatus capable of accurately measuring the positions of the positioning pins and therefore is able to stably place the article on the predetermined placement position.

A method for measuring the positioning pins according to a preferred embodiment of the present invention involves causing the transport vehicle to lower the touch panels from above the placement position so that the touch panels individually touch the positioning pins and thus is able to measure the positions of the positioning pins easily and accurately.

A measurement method involving calculating the inclination of the plane including upper ends of the positioning pins based on the amounts of ascent of the touch panels is able to easily and reliably calculate the inclination of a shelf or the like having the positioning pins provided thereon.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
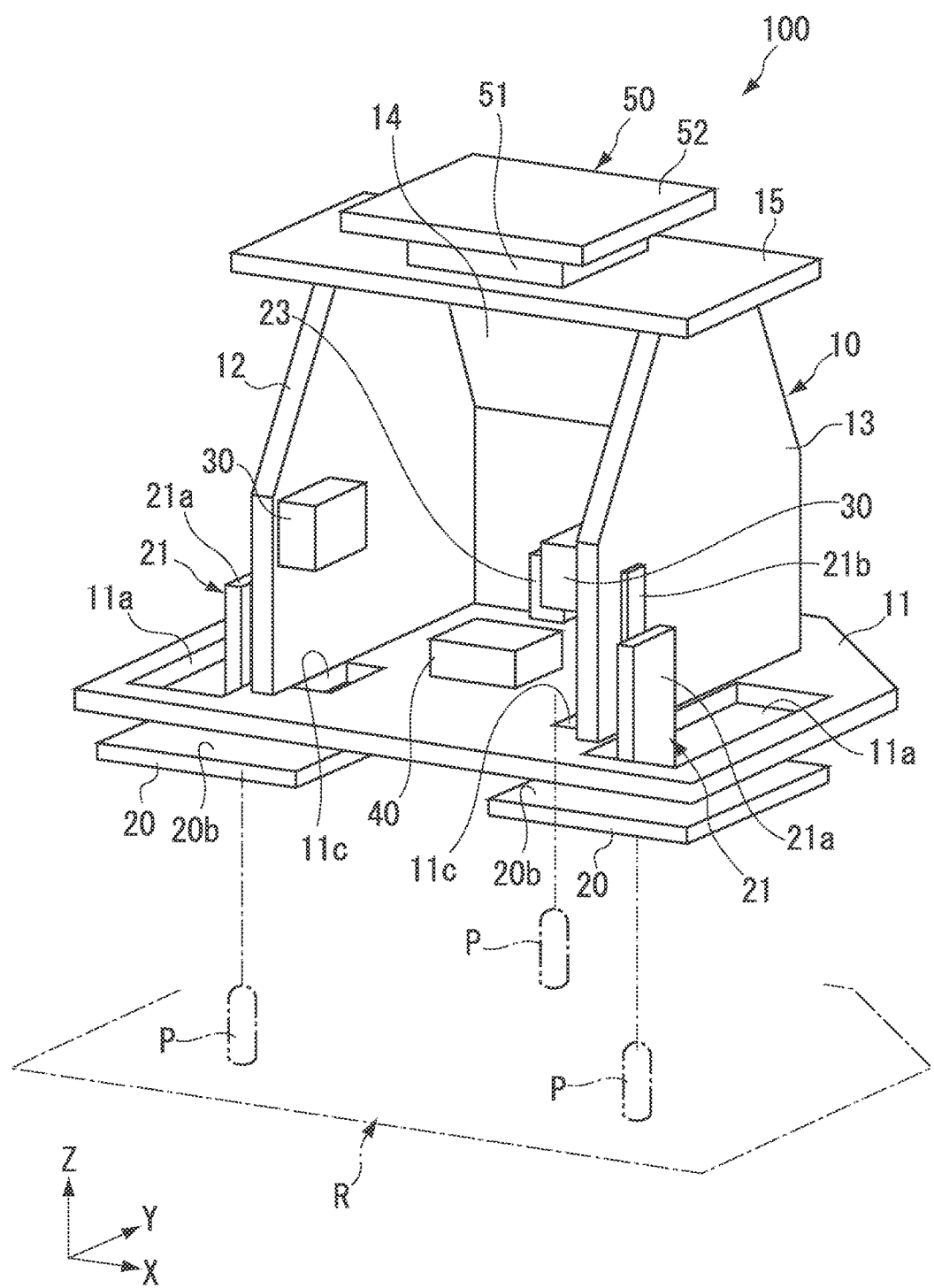
FIG. 1 is a perspective view showing an example of a teaching apparatus of a preferred embodiment of the present invention.

Now, preferred embodiments of the present invention will be described with reference to the drawings. However, the present invention is not limited to the following description. To clarify the preferred embodiments, the drawings are scaled as necessary, for example, partially enlarged or highlighted. In the drawings, directions are shown by an XYZ coordinate system. In the XYZ coordinate system, a plane parallel with the horizontal plane is defined as an XY-plane. Any direction parallel with the XY-plane is referred to as an X-direction; a direction perpendicular to the X-direction as a Y-direction; and the direction perpendicular to the XY-plane as a Z-direction. In the drawings, the directions of arrows represent the positive X-, Y-, and Z-directions, and the directions opposite to the directions of the arrows represent the negative X-, Y-, and Z-directions.

Figure 2:
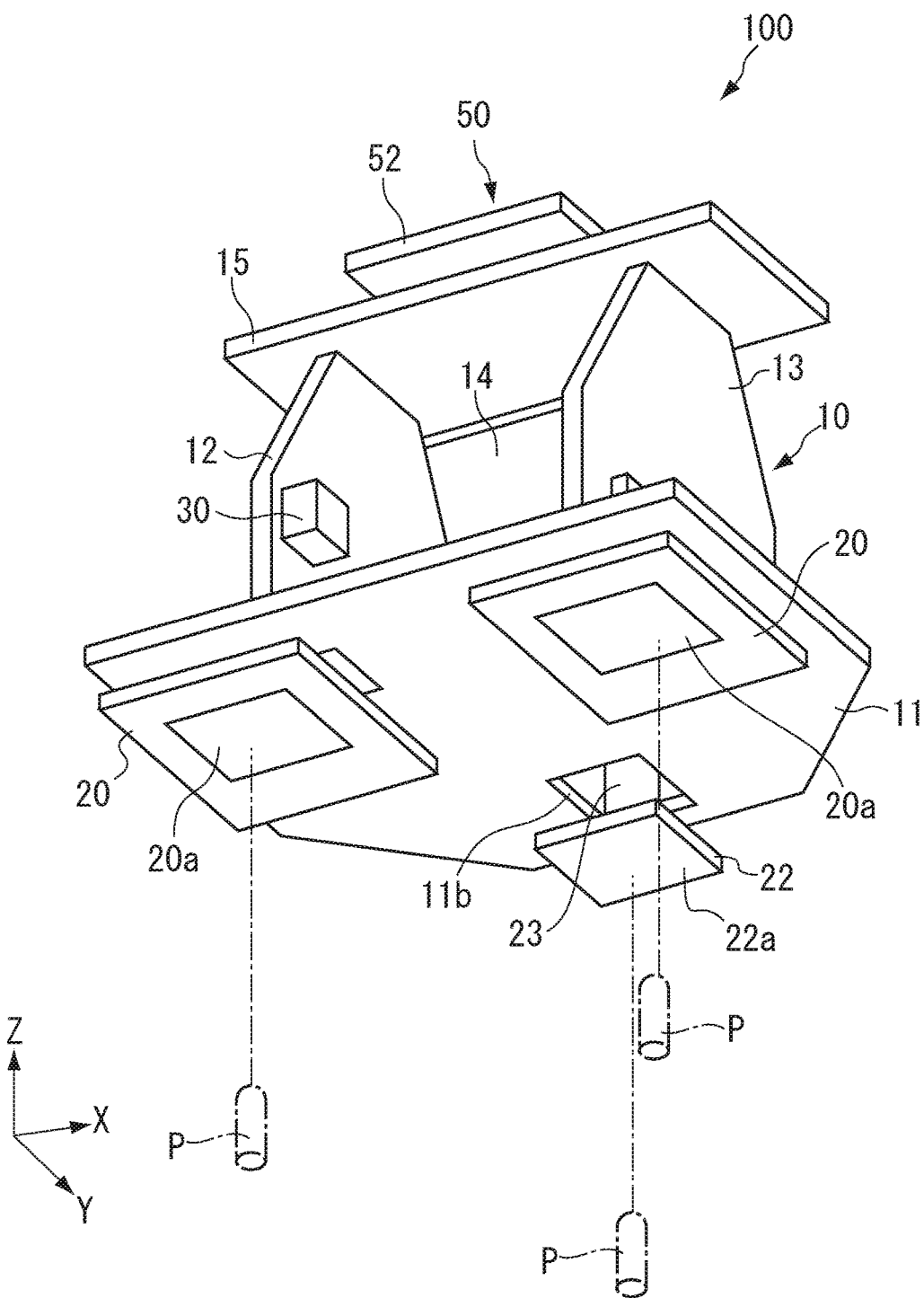
FIG. 2 is a perspective view of the teaching apparatus shown in FIG. 1 seen from below.
Figure 3:
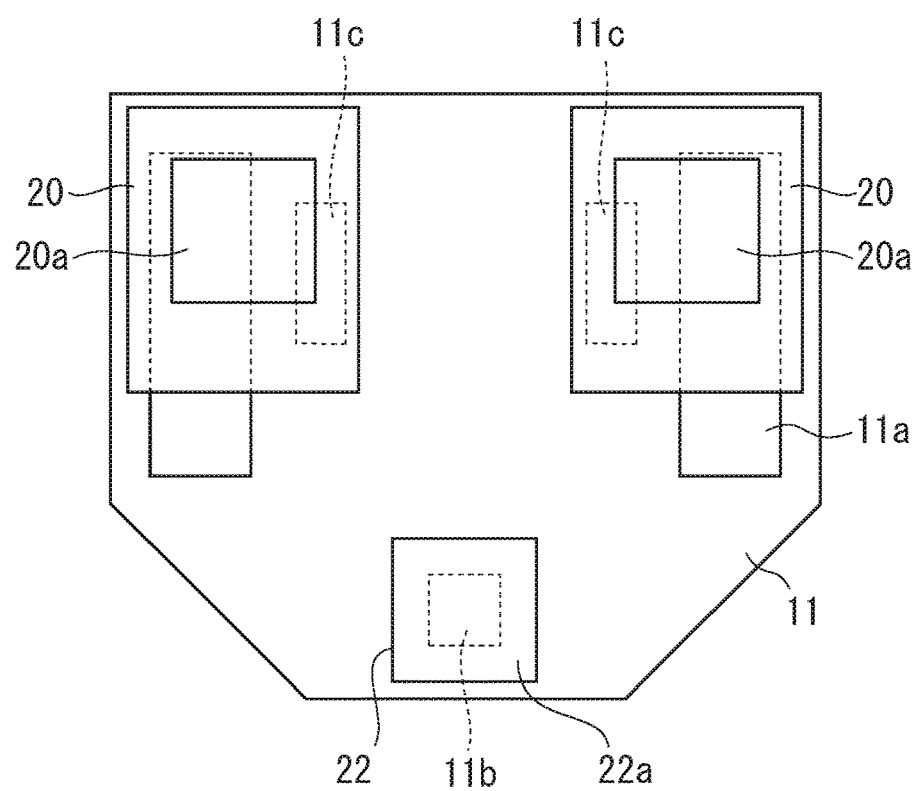
FIG. 3 is a bottom view of the teaching apparatus shown in FIG. 1.

A teaching apparatus of the present preferred embodiment will be described with reference to the drawings. FIGS. 1 and 2 are perspective views showing an example of a teaching apparatus 100 of the present preferred embodiment. FIG. 2 is a perspective view of the teaching apparatus 100 shown in FIG. 1 seen from below. FIG. 3 is a drawing showing the teaching apparatus 100 seen from the −Z-side.

The teaching apparatus 100 shown in FIGS. 1 to 4 is transported by, for example, a transport vehicle 101 (see FIG. 5, etc.) that transports an article, such as a container, in a clean room. The teaching apparatus 100 measures the positions of multiple positioning pins P disposed in the placement position R of the article transported by the transport vehicle 101. In the present preferred embodiment, preferably three positioning pins P are disposed in the placement position of the single container, for example. The three positioning pins P are disposed in positions corresponding to the vertices of an isosceles triangle or regular triangle one-on-one. Three radial grooves into which the three positioning pins P are able to be inserted, are preferably provided in the bottom of the container to be transported. The teaching apparatus 100 of the present preferred embodiment measures the positions of the three positioning pins P and teaches the placement position R of the container to a transport system SYS.

As shown in FIGS. 1 and 2, the teaching apparatus 100 includes an apparatus body 10, multiple touch panels 20, ascent/descent amount detectors 30, a level 40, and a flange (supported portion) 50. The teaching apparatus 100 also includes a controller (not shown) that centrally controls the above elements. The controller may be disposed inside or outside the apparatus body 10 of the teaching apparatus 100. If the controller is disposed outside the apparatus body 10, the apparatus body 10 may include a communication device capable of communicating with the controller by wire or wirelessly.

As shown in FIG. 1, the apparatus body 10 includes a bottom plate 11, side plates 12, 13, a rear plate 14, and a top plate 15. The bottom plate 11 is in the shape of, for example, a hexagon obtained by chamfering adjacent two corners of a rectangular board, but may be in any other shape such as a rectangle, circle, or triangle. The bottom plate 11 is formed of a metal, resin, wood, or the like. The external shape of the bottom plate 11 may be approximately similar to the bottom shape of the container to be transported.

The side plates 12, 13 are disposed on the bottom plate 11 so as to be spaced from each other in the X-direction. The side plates 12, 13 are disposed so as to stand from the bottom plate 11 and such that the respective plate surfaces are opposed to each other. The side plates 12, 13 are formed of a metal, resin, wood, or the like. The side plates 12, 13 have the same or approximately the same shape. For example, the side plates 12, 13 are shaped so that the respective Y-direction sizes are reduced from the bottom plate 11 toward the top plate 15, but need not be shaped in this manner. Also, the side plates 12, 13 need not be in a plate shape and may be in the shape of a frame obtained by combining rod-shaped members.

The rear plate 14 is disposed on the +Y-side of the side plates 12, 13 and, as with the side plates 12, 13, so as to stand on the bottom plate 11. The rear plate 14 is also disposed so as to cover the space between the side plate 12 and the side plate 13 from the +Y-side. The top plate 15 is supported by the side plates 12, 13. The top plate 15 preferably has, for example, a rectangular shape, but may be in any other shape. The top plate 15 is disposed in parallel or substantially in parallel with the bottom plate 11. The rear plate 14 is formed of a metal, resin, wood, or the like. The rear plate 14 may have thereon any type of board, an external power supply, a connector electrically connectable with the outside, or the like.

As shown in FIGS. 2 and 3, the bottom plate 11 includes panel openings 11a, a plate opening 11b, and detection openings 11c. The panel openings 11a are provided in the bottom plate 11, one on the −X-side of the side plate 12, the other on the +X-side of the side plate 13. The plate opening 11b is provided in the +Y-side edge of the bottom plate 11. The detection openings 11c are provided on sides opposite to the panel openings 11a with the side plates 12, 13 therebetween. The detection openings 11c are provided below the corresponding ascent/descent amount detectors (to be discussed later).

The touch panels 20 are disposed on the −Z-side of the bottom plate 11. The touch panels 20 are disposed so as to correspond to the positions of the positioning pins P. In the present preferred embodiment, the touch panels 20 are disposed so as to correspond to two positioning pins P on the −Y-side, of the three positioning pins, as shown in FIGS. 2 and 3. More specifically, the touch panels 20 are disposed in two positions of the bottom plate 11: the −X- and −Y-side corner and the +X- and −Y-side corner.

The touch panels 20 are disposed in parallel or substantially in parallel with the bottom plate 11 and so as to be spaced from the −Z-side surface of the bottom plate 11 in the Z-direction. The touch panels 20 include detection regions 20a having, for example, a rectangular shape. The detection regions 20a are used by touch sensors. The detection regions 20a are provided on the −Z-side surfaces of the touch panels 20 and directed in the −Z-direction. The touch panels 20 are disposed such that the heights (Z-direction positions) of the respective detection regions 20a are aligned. For example, the detection regions 20a of the touch panels 20 are disposed so as to be able to touch the upper ends of the upward positioning pins P. The touch panels 20 detect the positions in which the positioning pins P touch the detection regions 20a, for example, as X- and Y-direction coordinates. Signals detected by the detection regions 20a are outputted to the controller (not shown).

The touch panels 20 are movable in the vertical direction (Z-direction) by elevation mechanisms 21. The touch panels 20 are independently movable in the vertical direction (Z-direction) with respect to the bottom plate 11 of the apparatus body 10 by the elevation mechanisms 21. Accordingly, ascent or descent of one touch panel 20 does not affect the other touch panel 20. The elevation mechanisms 21 slide the touch panels 20 in the vertical direction while keeping the touch panels 20 parallel or substantially parallel with the bottom plate 11.

Each elevation mechanism 21 includes a stay 21a and a guide rail 21b. The stay 21a is mounted on the +Z-side surface of the corresponding touch panel 20. The stay 21a is in the shape of, for example, a rectangular rod and is disposed so as to extend along the Z-direction. The stay 21a is also disposed such that it enters the panel opening 11a of the bottom plate 11, passes through the bottom plate 11, and extends along the −X-side of the side plate 12 or the +X-side of the side plate 13.

The stay 21a moves in the Z-direction together with the touch panel 20. The guide rail 21b is connected to the stay 21a and guides the stay 21a in the Z-direction. The guide rail 21b is fixed to the −X-side of the side plate 12 or the +X-side of the side plate 13. Note that in FIG. 1, the guide rail 21b is not shown since it is hidden behind the side plate 12.

When an upward (+Z-direction) force is not working on the touch panel 20, the stay 21a is being supported by the guide rail 21b so as to be suspended from the lower end of the guide rail 21b. As seen above, the touch panel 20 is disposed so as to be suspended from the apparatus body 10 by self-weight. For this reason, if an upward force is applied to the touch panel 20, the touch panel 20 is able to move upward along the guide rail 21b. This eliminates the need to use a driver or the like to raise or lower the touch panel 20, allowing for a reduction in the apparatus cost. Note that an elastic member such as a coil spring may be disposed between each touch panel 20 and the bottom plate 11 so that a downward (−Z-direction) elastic force is applied to the touch panel 20.

In the present preferred embodiment, a touch plate 22 is disposed on the −Z-side of the bottom plate 11, as shown in FIGS. 2 and 3. The touch plate 22 is disposed in a position corresponding to the remaining one positioning pin P to which the touch panels do not correspond, of the three positioning pins. More specifically, the touch plate 22 is disposed in the center in the X-direction of the bottom plate 11 and at the +Y-side edge thereof.

The touch plate 22 are disposed in parallel or substantially in parallel with the bottom plate 11 and so as to be spaced from the −Z-side surface of the bottom plate 11 in the Z-direction. For example, the lower surface of the touch plate 22 is disposed so as to be able to touch the upper end of the upward positioning pin P. The −Z-side surface 22a of the touch plate 22 is disposed such that the height (Z-direction position) thereof and the heights of the detection regions 20a of the touch panels 20 are aligned.

The touch plate 22 is also disposed so as to be movable in the Z-direction by an elevation mechanism 23. The touch plate 22 is movable in the vertical direction (Z-direction) with respect to the bottom plate 11 of the apparatus body 10 independently of the touch panels 20 by the elevation mechanism 23. The touch plate 22 is able to move in the vertical direction independently of the touch panels 20. Accordingly, ascent or descent of the touch panels 20 does not affect the touch plate 22. The elevation mechanism 23 slides the touch plate 22 in the Z-direction while keeping the touch plate 22 parallel or substantially parallel with the bottom plate 11. The elevation mechanism 23 has a configuration approximately similar to that of the elevation mechanisms 21 and includes a stay and a guide rail (not shown). For example, the stay of the touch plate 22 may be disposed along the rear plate 14 of the apparatus body 10 so as to be movable in the vertical direction while being guided by the guide rail provided on the rear plate 14.

As seen above, the teaching apparatus 100 is able to touch the three positioning pins P disposed in the placement position R of the article with the two touch panels 20 and the single touch plate 22. While the touch panels 20 detect touches on the positioning pins P, the touch plate 22 does not detect a touch on the positioning pin P. Note that if the positional relationships among the three positioning pins P are known in advance, the teaching device 100 is able to detect the positions of all the three positioning pins P by detecting the positions of the two positioning pins P using the two touch panels. The use of the two touch panels 20 in this manner allows for a reduction in the number of touch panels 20 to be used and thus for a reduction in the apparatus cost.

Figure 4:
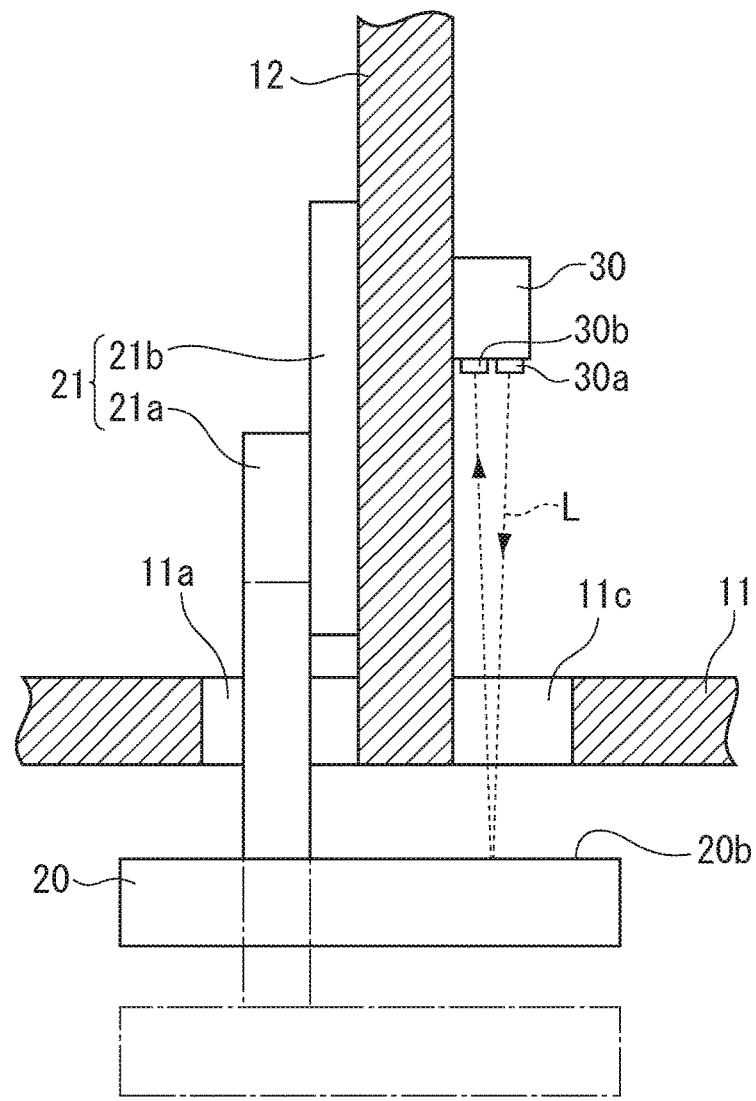
FIG. 4 is a sectional view showing an example of an ascent/descent amount detector.

As shown in FIG. 1, the apparatus body 10 includes the ascent/descent amount detectors 30. Each ascent/descent amount detector 30 measures the amount of ascent or descent of the corresponding touch panel 20. FIG. 4 is a drawing showing an example of the ascent/descent amount detector 30. As shown in FIG. 4, the ascent/descent amount detector 30 is mounted on the +X-side surface of the side plate 12 or the −X-side surface of the side plate 13 (see FIG. 1). In the present preferred embodiment, the ascent/descent amount detectors 30 are reflection laser rangefinders. Each ascent/descent amount detector 30 includes a light emitter 30a and a light receiver 30b. The light emitter 30a emits detection light L, such as laser light, downward (in the −Z-direction). The detection light L is reflected by the +Z-side surface 20b of the touch panel 20 through the detection opening 11c and enters the light receiver 30b. The light receiver 30b measures the distance to the touch panel 20 by detecting the detection light L.

The controller (not shown) calculates the amount of ascent or descent of each touch panel 20 based on the output of the corresponding ascent/descent amount detector 30. The distance between the light emitter 30a and the surface 20b varies with ascent or descent of the touch panel 20. Accordingly, the controller is able to calculate the amounts of ascent or descent of the touch panels 20 by measuring the distances to the touch panels 20 using the ascent/descent amount detectors 30. By detecting the amounts of ascent or descent of the touch panels 20, the controller is able to measure the heights of the upper ends of the positioning pins P. The controller may calculate the inclination of the placement position R based on the heights of the upper ends of the positioning pins P.

Note that the ascent/descent amount detectors 30 need not be laser rangefinders and may be any type of measurement instruments capable of measuring the amounts of ascent or descent of the touch panels 20. For example, there may be used measurement instruments, such as linear encoders, that are able to measure the amounts of movement of the touch panels 20 or stays 21a by contact or non-contact.

As shown in FIG. 1, the apparatus body 10 includes the level 40. The level 40 is disposed on the bottom plate 11. The level 40 is disposed, for example, in the X- and Y-direction center or its vicinity on the bottom plate 11, but may be disposed in any other position. The level 40 detects the inclination of the apparatus body 10 (bottom plate 11) with respect to the horizontal plane (XY-plane). By detecting the inclination of the apparatus body 10 using the level 40 and measuring the amounts of ascent or descent of the touch panels 20 based on the inclination, the controller is able to measure the heights of the positioning pins P with respect to the horizontal plane.

As shown in FIG. 1, the apparatus body 10 includes the flange 50 (supported portion). The flange 50 is disposed on an upper portion of the top plate 15. The flange 50 is supported by the transport vehicle 101 (to be discussed later). The flange 50 includes a fixed portion 51 and a plate portion 52. The fixed portion 51 is fixed to an approximately central portion in the X- and Y-directions of the top plate 15. The plate portion 52 is fixed to an upper portion of the fixed portion 51. The plate portion 52 is structured such that the X- and Y-direction sizes thereof are greater than those of the fixed portion 51.

Figure 5:
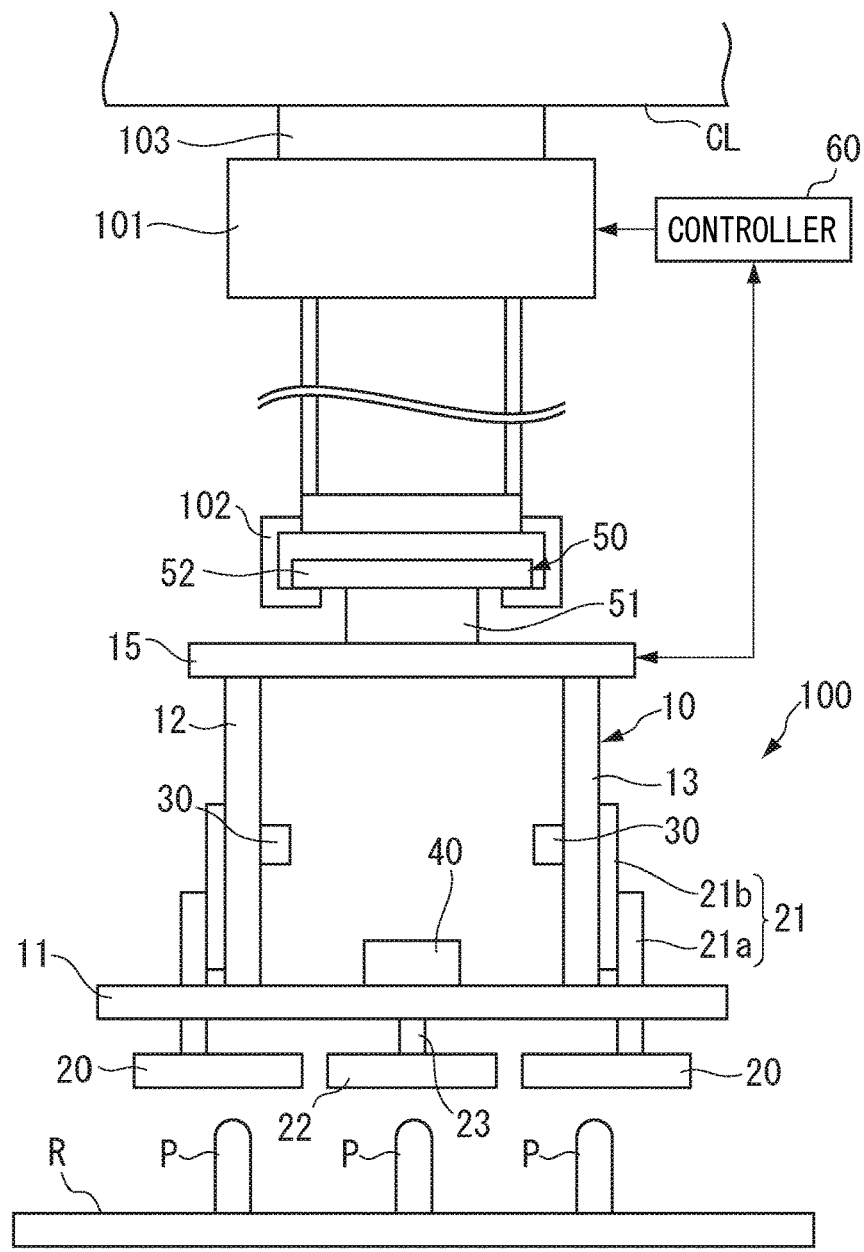
FIG. 5 is a drawing showing an example of the use state of the teaching apparatus.

FIG. 5 is a drawing showing an example of the use state of the teaching apparatus 100. As shown in FIG. 5, the transport vehicle 101 travels along a rail 103 installed on a ceiling CL. The transport vehicle 101 also includes a gripper 102 that is able to be raised and lowered. The flange 50 is in a shape that is able to be grasped by the gripper 102. The gripper 102 is able to reliably support the apparatus body 10 by grasping the plate portion 52 of the flange 50. The shape of the flange 50 is approximately similar to that of the flange of the container to be transported. Thus, the gripper 102 also is able to be used when transporting the container.

As shown in FIG. 5, the teaching apparatus 100 of the present preferred embodiment is transported while being suspended from the gripper 102 of the transport vehicle 101 with the flange grasped by the gripper 102, based on an instruction of a controller 60. By lowering the gripper 102 in this state and thus lowering the teaching apparatus 100, it is possible to cause the touch panels 20 and the touch plate 22 to touch the positioning pins P in the placement position R. Note that the teaching apparatus 100 is controlled by the controller 60, but may be controlled by a controller different from the controller 60.

Figure 6:
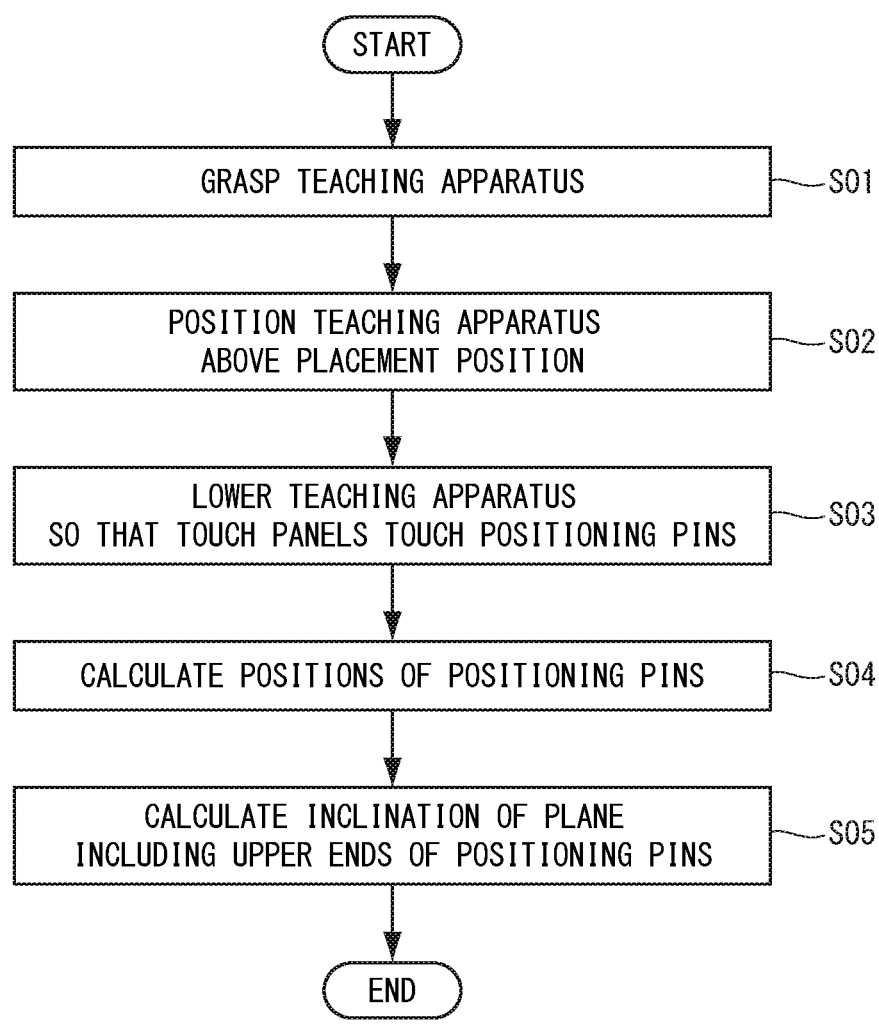
FIG. 6 is a flowchart showing steps to measure positioning pins of a preferred embodiment of the present invention.
Figure 7A:
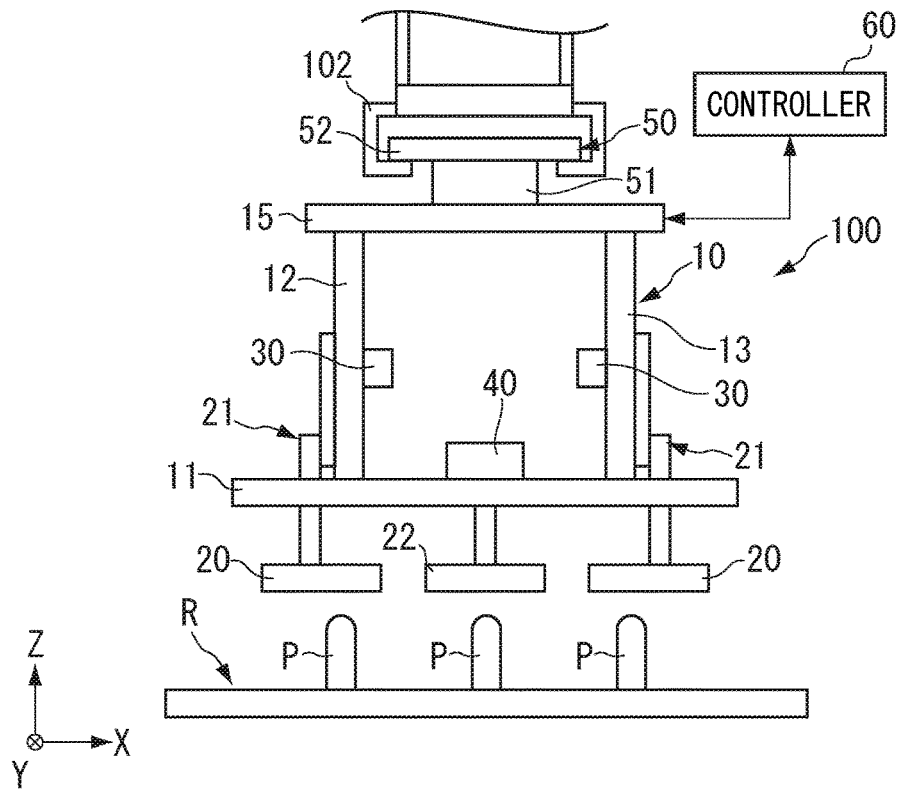
FIGS. 7A and 7B are process diagrams showing steps to measure the positioning pins.
Figure 7B:
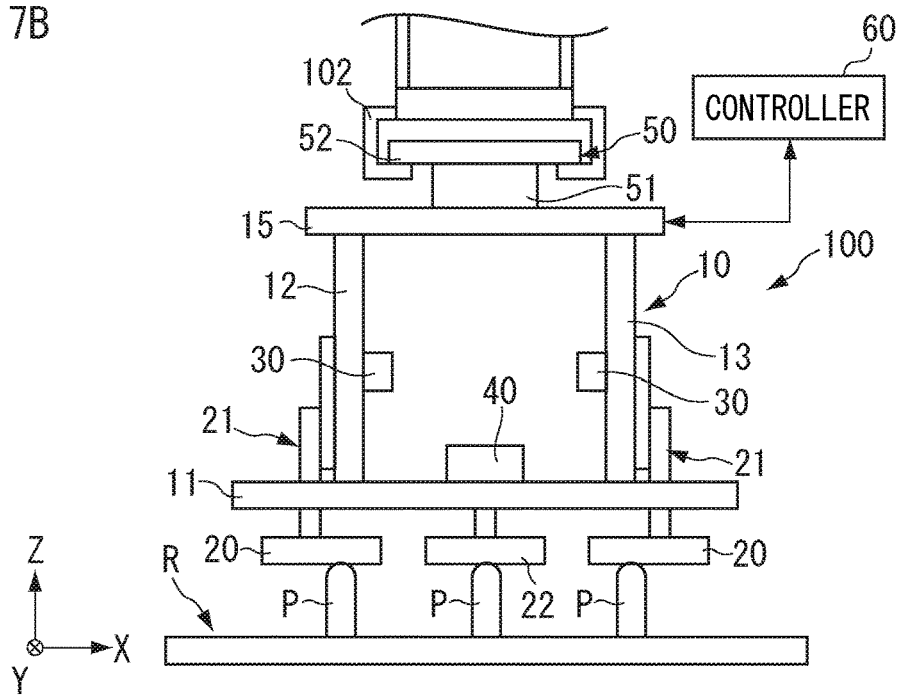

Next, there will be described a method for measuring the positions of the positioning pins P using the teaching apparatus 100 configured as described above. FIG. 6 is a flowchart showing steps to measure the positions of the positioning pins P. FIGS. 7A and 7B are process diagrams showing steps to measure the positions of the positioning pins P. The description will be made with reference to the flowchart shown in FIG. 6 and, when necessary, FIGS. 7A and 7B. The teaching apparatus 100 shown in FIG. 1 is used as a teaching apparatus 100.

The teaching apparatus 100 is stored in a predetermined storage location (e.g., in a storage cabinet) and used when necessary. The positions of the positioning pins P are measured, for example, when a new board processor, storage cabinet, or the like is introduced, or when a new transport vehicle 101 or transport system SYS is introduced. The positions of the positioning pins P may be measured for the purpose of measuring the aged deterioration or the like of the entrance/exit of the container after a lapse of a predetermined period. Before using the teaching apparatus 100, calibration or the like is performed on the touch panels 20.

First, as shown in FIG. 6, the controller 60 causes the transport vehicle 101 to move to the storage location in which the teaching apparatus 100 is stored and to grasp the teaching apparatus 100 using the gripper 102 (step S01). In step S01, the controller 60 positions the transport vehicle 101 above (+Z-side) the teaching apparatus 100 and then causes the transport vehicle 101 to lower the gripper 102 and to grasp the flange 50. In this state, the controller 60 causes the transport vehicle 101 to raise the gripper 102 and thus to lift the teaching apparatus 100. The transport vehicle 101 may be stopped in a predetermined position by the controller 60 or may be stopped in any position manually by the operator. Similarly, the gripper 102 may be lowered to a predetermined position by the controller 60 or may be lowered to any position manually by the operator.

Then, as shown in FIG. 6, the controller 60 causes the transport vehicle 101 to position the teaching apparatus 100 above the placement position R (step S02). At this time, the controller may cause the transport vehicle 101 to stop the teaching apparatus 100 in a predetermined position above the placement position R, or the operator may manually cause the transport vehicle 101 to stop the teaching apparatus 100 in any position.

Then, as shown in FIG. 6, the controller 60 causes the transport vehicle 101 to lower the gripper 102 so that the touch panels 20 and the touch plate 22 touch the positioning pins P (step S03). In lowering the gripper 102 in step S03, the controller 60 causes the transport vehicle 101 to lower the gripper 102 at high speed until the touch panels 20 and the touch plate 22 reach positions away from the positioning pins P by a predetermined distance, as shown in FIG. 7A. After the touch panels 20 and the like reach the positions away from the positioning pins P by the predetermined distance, the controller 60 causes the transport vehicle 101 to lower the gripper 102 at low speed so that the touch panels 20 and the like gradually approach the positioning pins P.

By reducing the time required to lower the teaching apparatus 100 as described above, it is possible to reduce the time required to measure the positions of the positioning pin P. Lowering the teaching apparatus 100 in this manner also significantly reduces or prevents strong shock to the touch panels 20 and the touch plate 22 and thus allows for prevention of damage to the teaching apparatus 100. By gradually lowering the touch panels 20 and the like, the touch panels 20 and the touch plate 22 touch the positioning pins P, as shown in FIG. 7B.

When the touch panels 20 detect the positioning pins P, the controller 60 causes the transport vehicle 101 to stop lowering the gripper 102. The touch panels 20 outputs the positions of the detection regions 20a (see FIGS. 2, 3) that the positioning pins P have touched, to the controller 60. Note that if the touch panels 20 do not detect the positioning pins P when the gripper 102 is lowered by a predetermined amount, the controller 60 may determine that an error has occurred and cause the transport vehicle 101 to stop lowering the gripper 102.

Described below is a case in which the upper ends of the positioning pins P differ in height. By lowering the teaching apparatus 100, a positioning pin P having the highest upper end first touches a corresponding touch panel 20 (or touch plate 22). Thus, the positioning pin P is detected by the touch panel 20. By lowering the teaching apparatus 100 in this state, the touch panel 20 is pushed upward by the positioning pin P and raised along the guide rail 21b. Thus, the inclination of the posture of the apparatus body 10 is significantly reduced or prevented.

By further lowering the teaching apparatus 100, a positioning pin P having the second highest upper end touches a corresponding touch panel 20 (or touch plate 22). Thus, the positioning pin P is detected by the positioning pin P. As seen above, if the upper ends of the positioning pins P differ in height, the positioning pins P touch and are detected by the touch panels 20 or the touch plate 22 in the descending order of the heights of the upper ends. In the present preferred embodiment, the touch panels 20 and the touch plate 22 are disposed so as to be able to be independently raised and lowered. Thus, even if the upper ends of the positioning pins P differ in height, the touch panels 20 and the touch plate 22 are raised or lowered when touching the positioning pins P. As a result, the teaching apparatus 100 is able to significantly reduce or prevent the inclination of the apparatus body 10 and to detect the positions of the positioning pins P accurately.

Then, as shown in FIG. 6, the controller 60 calculates the positions of the positioning pins P based on the detection results obtained by the touch panels 20 (step S04). In step S04, the controller 60 measures the X- and Y-direction positions of the positioning pins P based on the X- and Y-direction coordinates touched by the positioning pins P in the detection regions 20a of the touch panels 20. The controller 60 also calculates the amount of displacement of the teaching apparatus 100 in the X-direction, the Y-direction, and the direction around the Z-axis based on the measurement results obtained by the two touch panels 20. Note that the controller 60 is able to obtain the position of the positioning pin P that has touched the touch plate 22, from the positions of the two positioning pins P.

By using the positions of the positioning pins P calculated in step S04, it is possible to teach the transport vehicle 101 an accurate placement position R of the article. Note that if the apparatus body 10 itself is inclined with respect to the horizontal plane in step S04, the controller 60 may correct the positions of the positioning pins P using the detection results obtained by the level 40.

The controller 60 also calculates the inclination of a plane including the upper ends of the positioning pins P based on the amounts of ascent of the touch panels 20 and the touch plate 22 (step S05). If the upper ends of the positioning pins P have the same height, the amounts of ascent of the touch panels 20 and the touch plate 22 are equal to each other. On the other hand, if the upper ends of the positioning pins P differ in height, that is, if the plane including the upper ends is inclined, the amounts of ascent of the touch panels 20 differ from each other. For this reason, in step S05, the controller 60 calculates the inclination of the plane including the upper ends of the positioning pins P from the difference between the amounts of ascent of the touch panels 20. Thus, it is possible to predict, for example, the inclination of the article when the article is placed on the placement position R. Note that step S05 is performed optionally and need not be performed.

The controller 60 may perform steps S01 to S05 multiple times and then obtain the positions of the positioning pins P from the averages or the like of the measured values.

As seen above, according to the teaching apparatus 100 and the method for measuring the positions of the positioning pins P of the present preferred embodiment, the positioning pins P touch the touch panels 20 that are able to be independently raised and lowered. Accordingly, even if the upper ends of the positioning pins P differ in height, the touch panels 20 are independently raised and lowered. Thus, it is possible to significantly reduce or prevent the inclination of the apparatus body 10 and to measure the positions of the positioning pin P accurately.

Figure 8:
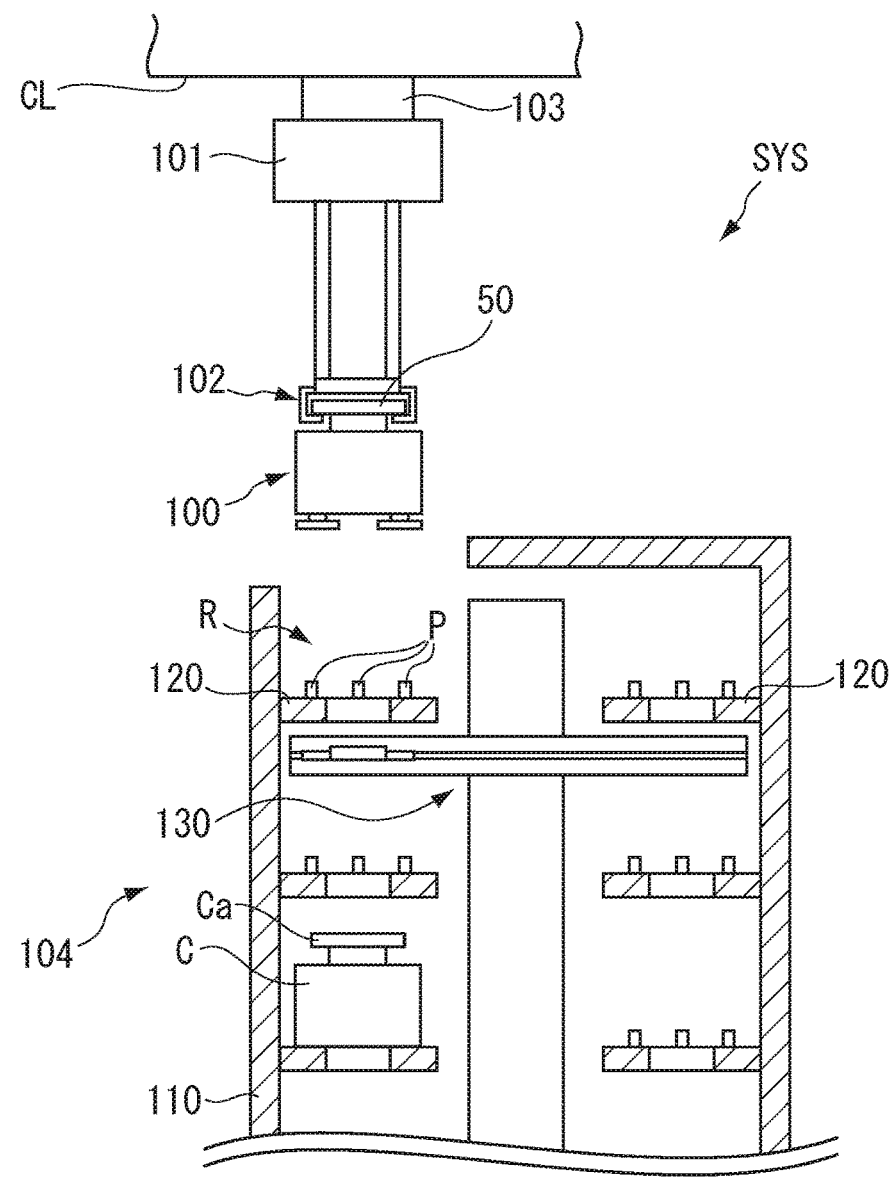
FIG. 8 is a drawing showing an example of a transport system of a preferred embodiment of the present invention.

Next, the transport system SYS of the present preferred embodiment will be described. FIG. 8 is a drawing showing an example of the transport system SYS. As shown in FIG. 8, the transport system SYS includes the transport vehicle 101 and the teaching apparatus 100. For example, the transport system SYS transports a container (article) C containing semiconductors, reticles, or the like between a board processor (not shown) and a storage cabinet 104 in a building. FIG. 8 shows a state in which the teaching apparatus 100 is being transported to the placement position R, which is the entrance/exit of the storage cabinet 104.

The transport vehicle 101 travels along the rail 103 installed along the Y-direction on the ceiling CL of a building such as a clean room. The transport vehicle 101 transports the container C or the teaching apparatus 100 by traveling along the rail 103. The transport vehicle 101 includes the gripper 102, as described above, and also includes an elevator (not shown), such as a hoist, to raise and lower the gripper 102.

The gripper 102 is able to grasp a flange Ca of the container C. By driving the elevator with the container C held by the gripper 102, the transport vehicle 101 is able to raise and lower the container C. Using the gripper 102 and the elevator, the transport vehicle 101 receives and passes the container C from and to the storage cabinet 104 and the load port of the board processor. As described above, the gripper 102 is able to grasp the flange 50 of the teaching apparatus 100. By driving the elevator with the teaching apparatus 100 held by the gripper 102, the transport vehicle 101 is able to raise and lower the teaching apparatus 100.

Multiple containers C are able to be stored on multiple shelves 120 on a wall 110 of the storage cabinet 104. Of the shelves 120, an upper-left shelf 120 is used as a placement position R in which the container C is received and passed from and to the transport vehicle 101. The container C is transferred between the upper-left shelf 120 serving as the placement position R and the other shelves 120 by a transfer device 130. Each shelf 120 is provided with positioning pins P to be inserted into grooves provided in the rear surface of the container C. The positioning pins P positions the container C on the shelf 120.

The transport system SYS places the teaching apparatus 100 in the placement position R using the transport vehicle 101 and measures the positions of the positioning pins P. Since the teaching apparatus 100 has sizes, shapes or the like similar to those of the container C, the carrying system SYS is able to transport the teaching apparatus 100 in a manner similar to that in which it transports the container C and thus to efficiently measure the positions of the positioning pins P.

As seen above, the transport system SYS includes the teaching apparatus 100 and therefore is able to easily and accurately measure the positions of the positioning pins P in the placement position R in which the container C is placed. Thus, the transport system SYS is able to easily and accurately perform teaching relating to the placement of the container C and to stably place the container C in the predetermined placement position R. The transport system SYS may include multiple teaching apparatuses 100. In this case, teaching apparatuses 100 except for one may be stored as replacements in case of a failure or the like, or the multiple teaching apparatuses 100 may be caused to individually measure the positions of the positioning pins P.

While preferred embodiments have been described above, the present invention is not limited thereto. Various changes can be made to the preferred embodiments without departing from the spirit and scope of the invention. For example, while, in the preferred embodiments described above, the teaching apparatus 100 has sizes, shapes or the like similar to those of the container C, it may have sizes or shapes different from those of the container C, for example, may have smaller sizes than those of the container C. While, in the preferred embodiments described above, the teaching apparatus 100 includes the two touch panels 20 and the single touch plate 22 corresponding to the three positioning pins P, it may include, for example, three touch panels 20. Thus, the teaching device 100 is able to measure the positions of the positioning pins P more accurately.

While, in the preferred embodiments described above, the touch panels 20 are disposed at the −X- and −Y-side corner and the +X- and −Y-side corner of the bottom plate 11 and the touch plate 22 is disposed in the X-direction center of the bottom plate 11 and at the +Y-side edge thereof, the two touch panels 20 and the single touch plate 22 may be disposed in a manner different from that in the preferred embodiments described above.

While, in the preferred embodiments described above, the teaching device 100 includes the flange 50 as a portion supported by the transport vehicle 101, it may include, for example, protruding pieces extending horizontally from the side plates 12, 13 as supported portions. In this case, the transport vehicle 101 may hold the apparatus body 10 by sandwiching the side plates 12, 13 under the protruding portions.

While, in the preferred embodiments described above, the transport vehicle 101 included in the transport system SYS is a transport vehicle that travels along the ceiling CL, it may be a transport vehicle, such as a rail guided vehicle (RGV), that travels on the ground. The contents of Japanese Patent Application No. 2015-168970 and all documents cited in the above preferred embodiments or the like are incorporated herein by reference as a part of the present description to the extent permitted by law.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A teaching apparatus that is transported by a transport vehicle capable of transporting an article and measures positions of a plurality of positioning pins disposed in a placement position of the article, the teaching apparatus comprising:
    an apparatus body; and
    a plurality of touch panels that are able to touch the plurality of positioning pins and be independently raised and lowered with respect to the apparatus body wherein
    the plurality of touch panels are disposed so as to correspond to a first positioning pin and a second positioning pin of the plurality of positioning pins; and
    the apparatus body includes a touch plate that is able to touch a third positioning pin of the plurality of positioning pins and be raised and lowered with respect to the apparatus body.

2. The teaching apparatus of claim 1, further comprising an ascent/descent amount detector that measures the amounts of ascent/descent of the plurality of touch panels with respect to the apparatus body.

3. The teaching apparatus of claim 1, further comprising a level that detects an inclination of the apparatus body with respect to a horizontal plane.

4. The teaching apparatus of claim 1, wherein the plurality of touch panels are suspended from the apparatus body and are able to be raised with respect to the apparatus body when touching the plurality of positioning pins.

5. The teaching apparatus of claim 1, wherein the apparatus body includes a supported portion that is able to be supported by the transport vehicle.

6. A transport system comprising:
    a transport vehicle that is able to move while supporting an article and transfers the article to a placement position in which a plurality of positioning pins are disposed, by lowering the article from above; and
    the teaching apparatus of claim 1 that is able to be transported by the transport vehicle and measures positions of the plurality of positioning pins.

7. A method for measuring positions of a plurality of positioning pins disposed in a position in which a transport vehicle places an article, the method comprising:
    causing the transport vehicle to lower a plurality of touch panels from above the placement position so that the plurality of touch panels individually touch the plurality of positioning pins, the plurality of touch panels being disposed so as to be able to be independently raised and lowered with respect to an apparatus body;
    disposing the plurality of touch panels so as to correspond to a first positioning pin and a second positioning pin of the plurality of positioning pins;
    providing the apparatus body with a touch plate that is able to touch a third positioning pin of the plurality of positioning pins and be raised and lowered with respect to the apparatus body; and
    calculating the positions of the plurality of positioning pins based on detection results obtained by the plurality of touch panels.

8. The method for measuring the positions of the plurality of positioning pins of claim 7, further comprising calculating an inclination of a plane including upper ends of the plurality of positioning pins based on amounts of ascent of the plurality of touch panels.

* * * * *